Figure 1:
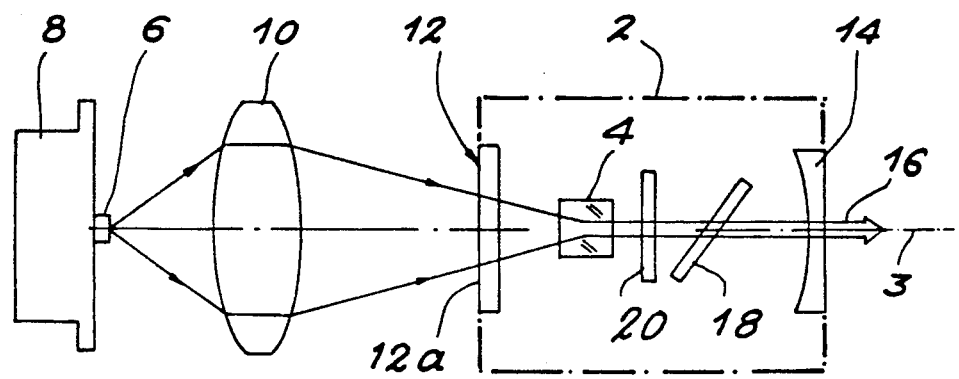

United States Patent
Faure et al.

[11] Patent Number: 5,173,911
[45] Date of Patent: Dec. 22, 1992

[54] MIXED SILICATES OF YTTRIUM AND LANTHANIDE AND LASER USING MONOCRYSTALS OF THESE SILICATES

[75] Inventors: Christian Faure, Saint Egreve; Richard Moncorge, Trevoux; Roselyne Romero, Sassenage; Christophe Wyon, St. Egreve, all of France

[73] Assignee: Commissariat a l'Energie Atomique, France

[21] Appl. No.: 782,534

[22] Filed: Oct. 25, 1991

[30] Foreign Application Priority Data

Oct. 25, 1990 [FR] France ............... 90 13231

[51] Int. Cl.$^5$ .............................................. H01S 3/16
[52] U.S. Cl. .............................. 372/41; 252/301.4 R
[58] Field of Search ............... 372/39, 41; 252/301.4, 252/518

[56] References Cited

U.S. PATENT DOCUMENTS

| | | | |
|---|---|---|---|
| 3,632,523 | 1/1972 | Hopkins et al. | 252/301.4 |
| 3,710,278 | 1/1973 | Hopkins et al. | 372/41 |
| 4,935,934 | 6/1990 | Ferrand et al. | 372/41 |
| 4,954,211 | 9/1990 | Belt et al. | 372/41 |
| 4,962,504 | 10/1990 | Aubert et al. | 372/41 |

FOREIGN PATENT DOCUMENTS 0253589 1/1988 European Pat. Off.

*Primary Examiner*—Leon Scott, Jr.
*Attorney, Agent, or Firm*—Hayes, Soloway, Hennessey & Hage

[57] ABSTRACT

Mixed silicates of yttrium and lanthanide and laser using monocrystals of these silicates. The laser has a laser cavity (2) containing as the light emitter a monocrystal (4), means (12,14) for amplifying the light from the monocrystal, means (14) for removing light from the laser cavity and optical pumping means (6), characterized in that the monocrystal is of formula (I):

$$Y_{2-2x-2y}M_{2x}Yb_{2y}SiO_5 \qquad (I)$$

in which M represents a lanthanide chosen from among erbium and thulium and x and y represent numbers such that $0 < x \leq 0.2$ and $0 < y \leq 0.2$.

13 Claims, 1 Drawing Sheet

MIXED SILICATES OF YTTRIUM AND LANTHANIDE AND LASER USING MONOCRYSTALS OF THESE SILICATES

DESCRIPTION

The present invention relates to mixed silicates of yttrium and lanthanide of the monophase type, particularly obtained in the form of monocrystals.

It is more particularly used in the field of microlasers for integrated optics, optical fibre telecommunications, medicine (microsurgery, treatment of the skin and eyes), the study of semiconductors and scientific research (spectroscopy of organic molecules and materials), as well as in the field of power lasers for carrying out remote analyses of the atmosphere and in space communications.

These lasers emit at ambient temperature in the ocular safety zone around 1.55 and 2 $\mu$m. They have a certain degree of wavelength tuneability.

In known manner, laser emitters supplying a wavelength close to 1.55 $\mu$m can be obtained by doping by $Er^{3+}$ ions of a matrix transparent at said wavelength, i.e. crystal or glass. The transition between the excited state $^4I_{13/2}$ and the fundamental state $^4I_{15/2}$ of $Er^{3+}$ ions leads to a three-level laser. The wavelength emitted by said transition at ambient temperature is highly dependent on the crystallographic environment of the $Er^{3+}$ ions, as is shown by the attached Table 1.

Lasers tuneable around 2 $\mu$m operating at ambient temperature have already been produced from well known laser materials, namely

doped with $Tm^{3+}$ and/or $Ho^{3+}$ ions. These lasers respectively use electron transitions between the $^3F_4$ level and the fundamental level $^3H_6$ of the ions and between the $^5I_7$ level and the fundamental level $^5I_8$ of $Ho^{3+}$ ions. Consequently these are three-level lasers for which the population of the fundamental level at ambient temperature has a preponderant function.

A very important property of $Er^{3+}$, $Ho^{3+}$ and $Tm^{3+}$ ions is the high probability of energy transfers between these excited ions, which leads to cross-relaxation and up-conversion, which often limit the laser efficiency of the transitions in the infrared.

It is therefore possible to obtain a laser emitting green light from crystals of $YAlO_3$, $Y_3Al_5O_{12}$, $Y_3Sc_2Ga_3O_{12}$, $LiYF_4$ or $YF_3$ doped by $Er^{3+}$ ions and a laser emitting in the blue from $liYF_4$ crystals doped with $Tm^{3+}$ ions, when the monocrystals are pumped in the near infrared. It is then obvious that the efficiency of the stimulated characteristic infrared emissions of these ions around 1.55 and 2 $\mu$m is significantly affected.

Glasses and $Er^{3+}$ doped silica fibres would appear to partly obviate the disadvantages of the aforementioned monocrystalline materials. Apart from the fact that these $Er^{3+}$ doped matrixes have a stimulated emission in the maximum ocular safety range (Table I), the glasses and fibres have a high density of phonons, which makes it possible to depopulate the electron levels of the $Er^{3+}$ ions, optionally populated by energy transfers between these ions, by non-radiative relaxation processes. Unfortunately the thermomechanical properties and in particular the thermal conductivity of glasses and fibres, which are much lower than those of the aforementioned monocrystalline materials, are not adequate to permit the construction of a laser having an average high power.

In addition the production of a power laser emitting around 1.55 and 2 $\mu$m necessarily involves the use in the laser cavity of a monocrystalline material (due to its good thermomechanical properties) liable to be doped by $Er^{3+}$, $Tm^{3+}$ and $Ho^{3+}$ ions and only having for these doping processes a very low probability of energy transfer between these ions.

One of the solutions for minimizing or even eliminating these energy transfers is to isolate the active $Er^{3+}$, $Ho^{3+}$ and $Tm^{3+}$ ions from one another by using host matrixes based on very voluminous anion-cation groups, such as silicates. Moreover, silicates, like glasses and fibres, have the property of high phonon densities. Therefore, the electron levels of the active ions optionally populated by cross-relaxation and/or up-conversion are preferably deexcited by phonon-assisted, non-radiative relaxation processes up to the upper level of the laser transition in the infrared, which leads to a corresponding increase in the efficiency of emissions stimulated around 1.5 and 2 $\mu$m.

Among the silicates, yttrium oxyorthosilicate monocrystals $Y_2SiO_5$, hereinafter called YSO, doped by a rare earth have interesting luminescent properties.

The luminescent properties of $Ho^{3+}$ ions in $Er^{3+}$ codoped and $Er^{3+}$ and $Tm^{3+}$ codoped YSO monocrystals have already been studied by A.M. Morozov et al (Opt. Spectrosc., vol. 41, 6 (76), p.641-642) and have been used for producing a laser pumped by flashlamps around 2.1 $\mu$m and which only functions for T<220K.

In order to increase the pumping efficiency and therefore the overall efficiency of the laser based on active $Ho^{3+}$ ions, the YSO monocrystals are codoped with $Er^{3+}$ and $Tm^{3+}$ ions in order to increase the mean absorption coefficient of this material in the emission zone of lamps. The $Er^{3+}$ and $Tm^{3+}$ ions are used as sensitizers of the stimulated emission of effectively active $Ho^{3+}$ ions. These codopings have also been studied in YAG and $liYF_4$ crystals (E.P. Chicklio et al., IEEE J. of Quant. Electr., vol. QE 8, 2 (1972), p.225-234).

$Er^{3+}$ and $Tm^{3+}$ ions are intermediates between the pumping light emitting by the lamps and the $Ho^{3+}$ ions, which are alone responsible for the stimulated emission around 2.1 $\mu$m. The probability of energy transfer between the $Er^{3+}$ and $Tm^{3+}$ ions on the one hand and the $Ho^{3+}$ ions on the other is very great. A.M. Morozov did not observe any stimulated emission from $Er^{3+}$ and $Tm^{3+}$ ions.

In addition, $Nd^{3+}$ ion-doped YSO crystals have been produced having an effective stimulated emission at 0.912 and 1.075 $\mu$m, as described in the article by K. S. Bagdasarov et al, Sov. Phys. Dokl., vol. 18, 10 (74), p.664.

The invention relates to novel mixed silicates of yttrium and lanthanide in monocrystalline form usable as laser emitters and more particularly making it possible to obviate the disadvantages referred to hereinbefore. In particular, these silicates have an effective stimulated emission at ambient temperature usable in lasers having an average high power emitting in the infrared.

More specifically, the present invention relates to monophase yttrium and lanthanide oxyorthosilicates doped with $Er^{3+}$ or $Tm^{3+}$ ions and optionally codoped by $Yb^{3+}$ ions.

These oxyorthosilicates are of the following general formula (I):

$$Y_{2-2x-2y}M_{2x}Yb_{2y}SiO_5 \quad (I)$$

in which M represents a lanthanide chosen from erbium and thulium and x an y represent numbers such that $0<x\leq0.2$ and $0\leq y\leq0.2$.

These doped yttrium oxyorthosilicates can easily be produced in the form of monocrystals by conventional procedures of pulling from a molten bath, such as the Czochralski or Bridgman method.

The ion radii of the $Er^{3+}$ and $Tm^{3+}$ ions are close to those of $Yb^{3+}$ ions and the segregation coefficient of these lanthanide ions is close to 1 and the melting of these silicates is said to be congruent. This facilitates the crystal growth of these silicates thus making it possible to obtain large, good quality crystals by the Czochralski method industrially used for the production of power lasers.

The thermomechanical properties of YSO and in particular the thermal conductivity are close to those of the aluminium and yttrium garnet of formula $Y_3Al_5O_{12}$ than those of glasses. This good thermal conductivity permits a good dissipation of heat from the emitting crystal, which is necessary for producing a power laser.

Lasers using monocrystals of silicates according to the invention can be optically pumped by lamps or one or more laser diodes. Preference is given to the use of laser diodes for optical pumping. Thus, these laser diodes have the advantage of being extremely small, considerably reducing the overall dimensions of the laser. Moreover, they offer a certain wavelength tuneability and an excellent efficiency, which improves the efficiency of the laser effect from electric current compared with lamp pumping.

In the mixed silicates according to the invention, the laser activator is the $Er^{3+}$ or $Tm^{3+}$ ion and the laser sensitizer is the $Yb^{3+}$ ion.

According to a first main characteristic of the invention, the mixed yttrium and lanthanide silicates have the following formula (11):

$$Y_{2-2x-2y}Er_{2x}Yb_{2y}SiO_5$$

in which x and y are numbers such that $0<x\leq0.55$ and $0\leq y\leq0.2$.

These silicates are single phase and produced in monocrystalline form for producing lasers emitting in the infrared around 1.55 μm with a certain tuneability.

When excited with the aid of a laser diode, the YSO:$Er^{3+}$ monocrystals are in particular characterized by a wide fluorescence band of 1.45 to 1.7 μm with a maximum fluorescence around 1.545 μm, which is the maximumocular safety zone.

The life of the excited state $^4I_{13/2}$ of a YSO monocrystal of formula (I) for $x=0.1$ and $y=0$ is equal to 9.2 ms, which makes it possible to store a considerable energy when these crystals are pumped with the aid of xenon or krypton lamps, laser diodes emitting either at 0.79 μm or at 0.98 μm, or at 1.45 to 1.48 μm.

According to the invention, the $Er^{3+}$ ion doping rate varies from $x=0.003$ for pumping by a laser diode at 1.45 to 1.48 μm to $x=0.15$ for pumping by lamps. The optimum occurs with values of x between 0.01 and 0.03.

The ytterbium doping according to the invention makes it possible to increase the pumping efficiency of lasers based on YSO:Er, when the latter are pumped with the aid of a laser diode emitting at 0.79 or 0.98 μm or lamps. This codoping, already used in $Er^{3+}$ doped phosphate glasses, has the advantage of associating with the fine absorption bands of $Er^{3+}$ ions, a wide absorption band around 0.99 μm which can be populated either by non-radiative deexcitation of the upper levels of $Er^{3+}$ ions, or by pumping with the aid of a laser diode at 0.98 μm. The ytterbium codoping rate can be between $y=0.08$ and $y=0.2$, when said codoping is used.

According to another main feature of the invention the mixed monophase yttrium and lanthanide silicates have the following formula (III):

$$Y_{2-2x}Tm_{2x}SiO_5 \quad (III)$$

in which x is a number such that $0<x0.2$.

When these yttrium thulium silicates are produced in the form of monocrystals and placed in a laser cavity, they have a very intense and very wide fluorescence band between 1.5 and 2.1 μm, with several maxima at about 1.72, 1.8, 1.94 and 2.02 μm, when they are excited with the aid of a laser diode at 0.79 μm. The life of the $^3F_4$ emitter level of the stimulated emission is 1.3 ms for a crystal of formula (1) with $x=0.1$ and $y=0$, which makes it possible to store significant energy in this level, when said crystal is pumped with the aid of lamps or laser diodes.

The stimulated emission of a YSO:Tm-based laser pumped by lamps or laser diode is continuously tuneable from 1.7 to 2.05 μm at ambient temperature.

As a function of the pumping method used for producing the tuneable laser, the $Tm^{3+}$ ion doping rate varies between 0.005 and 0.2.

As the mixed silicates according to the invention are to be used as laser emitters emitting in the infrared, in the ocular safety zone and at ambient temperature, the invention also relates to a laser having a laser cavity containing as the light emitter a silicate monocrystal of formula (I), means for amplifying the light from the monocrystal, means for removing the light from the laser cavity and optical pumping means.

This laser is in particular a wavelength-tuneable laser and consequently has tuneability means.

The invention is described in greater detail hereinafter in non-limitative, illustrative manner, with reference to the attached drawings, wherein show:

FIG. 1 diagrammatically a continuously operating power laser according to the invention and pumped by a laser diode.

Figure 2:
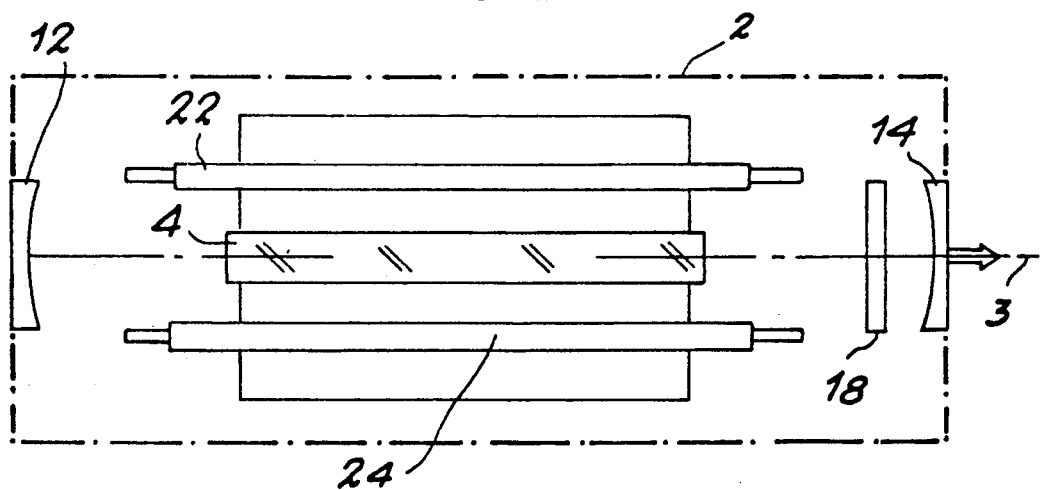

FIG. 2 diagrammatically a power laser according to the invention pumped by lamps.

A description will now be given of the production of a monocrystal of a silicate according to the invention using the Czochralski growth method. For this purpose, very pure commercially available powders of yttrium, silicon, erbium, thulium and optionally ytterbium powders are weighed in the desired proportions, followed by mixing and calcining at 1500° C. The thus obtained powder mixture is then placed in an iridium crucible. It is then brought to the melting point of close to 2100° C., protected from atmospheric oxygen, so as to form a molten bath.

It is also possible to form this molten bath starting with a coprecipitate of hydroxide in an aqueous or non-aqueous solvent of $Y^{3+}$, $Si^{4+}$, $Er^{3+}$, $Tm^{3+}$ and optionally $Yb^{3+}$ ions. The coprecipitate can be obtained by the action of ammonia on nitrates or chlorides of the different metallic elements which are commercially available. The coprecipitate obtained is then treated at 400° C. in a ventilated atmosphere until complete dehydration takes place, followed by calcining at 1500° C. The product obtained is then placed in an iridium crucible for forming the molten bath.

A monocrystalline nucleus of the same composition as the molten bath and e.g. cut parallel to the direction b of the crystal lattice is then brought into contact with the bath and is subsequently raised, whilst rotating on itself. Therefore the monocrystal is progressively formed at the end of the nucleus in a direction imposed by the latter. The pulling rate is 0.3 to 2 mm/h and the rotation speed is 5 to 40 r.p.m.

Table II gives examples of monocrystals of silicates according to the invention obtained by the Czochralski method from oxide powders of different ions.

The left-hand part of the table gives the initial molar percentage composition on the basis of which were produced the monocrystals and the right-hand part gives the formula of the crystal obtained.

FIG. 1 diagrammatically shows a continuously operating power laser using a monocrystal of a silicate according to the invention.

This laser comprises a laser cavity 2 containing a bar 4 of a silicate according to the invention. A laser diode 6 supported by a heat dissipating element 8 makes it possible to irradiate the bar 4, via a convergent lens 10 and thus ensure the optical pumping of the bar 4. A cooling device for the bar 4 of the water circulating type can be placed around the latter.

The laser cavity 2 is constituted by a dichroic input mirror 12 placed in the vicinity of the bar 4 and an output mirror 14. The input mirror 12 is transparent to the light emitted by the laser diode 6 and opaque to that emitted by the monocrystal 4. The output mirror 14 is partly transparent to the light emitted by the monocrystal 4.

The excitation of the bar 4 leads to a stimulated emission of the latter, which is reflected onto the mirror 14 and then again traverses the bar 4, where it is amplified. The amplified laser beam is then reflected by the mirror 12 towards the bar 4 and so on.

The laser beam 16, which has been sufficiently amplified in the laser cavity 2, then passes out through the mirror 14 along the axis 3.

The wavelength tuneability can be obtained with the aid of a wavelength selection system 18, placed between the bar 4 and the output mirror 14 and of the Brewster angle prism type or the Lyot filter type formed from several birefringent material plates. In addition, a solid standard 20 having a plate with parallel faces can be inserted between the bar 4 and the wavelength selector 18 in order to fix the emission wavelength. It is also possible to use the silicates according to the invention in a power laser of the type shown in FIG. 2.

The cavity 2 of this laser has an input mirror 12, an output mirror 4 and a bar 4 of a monocrystalline silicate according to the invention. On either side of the bar 4 are provided gas lamps 22,24 and in particular high intensity, krypton or xenon flashlamps. These lamps have an elongated shape and are oriented parallel to the axis 3 of the laser in order to ensure a longitudinal optical pumping of the bar 4. A device for circulating water around the bar 4 can be provided in order to ensure its cooling.

The laser cavity 2 also incorporates a wavelength selector 18, when it is wished to have a wavelength-tuneable laser.

EXAMPLE 1

A 5 mm thick platelet was cut from the monocrystal 1 in Table II perpendicular to the pulling axis b and then polished. A 5 mm diameter bar was then cored along the axis b and placed in a laser cavity 2 like that shown in FIG. 1.

The bar is pumped with the aid of a laser diode 6 emitting at 0.79 to 0.80 μm, or at 0.97 to 0.98 μm, or at 1.45 to 1.48 μm. The face 12a of the input mirror 12 must be given an anti-reflection treatment for one or other of these wavelengths.

At 1.56 μm, the reflectivity R1 of the input mirror must be at a maximum, i.e. $R1 \geq 99.8\%$, whereas that of the output mirror, designated R2, varies between 95 and 99%.

The laser beam 16 supplied by said cavity has a wavelength of 1.56μm and is monomodal. Its output power is linearly dependent on the power emitted by the laser diode. Advantageously, the faces of the bar 4 parallel to the mirror 12 are given an antireflection treatment at 1.56 μm.

EXAMPLE 2

A bar, whose diameter can vary between 4 and 10 mm and whose length is imposed by the useful monocrystal length produced is cored along axis b in crystal 3. The two faces of the bar are then polished, whilst respecting a very good parallelism, then given an anti-reflection treatment at 1.56 μm. This bar is placed in a cavity of the type shown in FIG. 2 and pumped with the aid of continuous or pulsed xenon or krypton lamps 22,24.

The reflectivity R1 of the input mirror 12 is at a maximum at 1.56μm, i.e. $R1 \geq 99.8\%$, whereas that of the output mirror R2 can vary between ween 95 and 99%.

The energy or output power of the laser at 1.56 μm varies linearly with the energy or power emitted by the lamps.

EXAMPLE 3

A 5 mm thick platelet is cut perpendicular to the pulling axis b of crystal No. 5 and then polished A diameter 5 mm bar is then cored along axis b and given an anti-reflection treatment in the range 1.7 to 2.05 μm. This bar is then placed in a cavity 2 identical to that shown in FIG. 1 and pumped with the aid of a laser diode emitting at 0.791 μm.

The input mirror face 12a is given an anti-reflection treatment at 0.7 μm. The reflectivity R1 of the input mirror 12 in the tuneability range of the laser between 1.7 and 2.05 μm must be at a maximum, i.e. $R1 \geq 99.8\%$, whereas that of the output mirror R2 can vary between 92 and 99% in the same wavelength range.

The tuneability of (he laser beam between 1.7 and 2.05 μm is obtained with the aid of the standard 20 and/or a Lyot filter 18, given an anti-reflection treatment between 1.7 and 2.1 μm.

The power supplied by said laser varies linearly with the power emitted by the laser diode and is at a maximum around 1.7 to 1.96μm.

TABLE I

| $Er^{3+}$ ion receiving matrix | Phosphate glasses | $SiO_2$ fibres | $Y_3Al_5O_{12}$ |
|---|---|---|---|
| Wavelength of $^4I_{13/2} \rightarrow ^4I_{15/2}$ at T = 300K (μm) | 1.54 | 1.53–1.57 | 1.64 |

TABLE II

| Ex. | Initial composition (molar %) | | | | | Crystal obtained |
|---|---|---|---|---|---|---|
| | $Y_2O_3$ | $SiO_2$ | $Er_2O_3$ | $Yb_2O_3$ | $Tm_2O_3$ | |
| 1 | 49.5 | 50 | 0.5 | | | $Y_{1.98}Er_{0.02}SiO_5$ |
| 2 | 42.5 | 50 | 7.5 | | | $Y_{1.70}Er_{0.30}SiO_5$ |
| 3 | 44.75 | 50 | 0.25 | 5 | | $Y_{1.79}Er_{0.01}Yb_{0.2}SiO_5$ |
| 4 | 39.875 | 50 | 0.125 | 10 | | $Y_{1.595}Er_{0.005}Yb_{0.4}SiO_5$ |
| 5 | 47 | 50 | | | 3 | $Y_{1.88}Tm_{0.12}SiO_5$ |
| 6 | 44 | 50 | | | 6 | $Y_{1.76}Tm_{0.24}SiO_5$ |
| 7 | 40 | 50 | | | 10 | $Y_{1.6}Tm_{0.4}SiO_5$ |

We claim:

1. A mixed monophase yttrium and lanthanide silicate of the following formula (II):

$$Y_{2-2x-2y}Er_{2x}Yb_{2y}SiO_5$$

in which x and y are numbers such that $0 < x \leq 0.15$ and $0 \leq y \leq 0.2$.

2. A silicate according to claim 1, characterized in that x satisfies the equation $0.005 \leq x \leq 0.15$.

3. A silicate according to claim 1, characterized in that x satisfies the equation $0.01 \leq x \leq 0.03$.

4. A silicate according to claim 1, characterized in that y satisfies the equation $0.08 \leq y \leq 0.2$.

5. A silicate according to claim 1, characterized in that it is of formula $Y_{1.98}Er_{0.02}SiO_5$.

6. A silicate according to claim 1, characterized in that it is of formula $Y_{1.74}Er_{0.06}Yb_{0.20}SiO_5$.

7. A mixed monophase yttrium and lanthanide silicate having the following formula (III):

$$Y_{2-2x}Tm_{2x}SiO_5 \quad (III)$$

in which x is a number such that $0 < x \leq 0.2$.

8. A silicate according to claim 7, characterized in that x satisfies the equation $0.005 \leq x \leq 0.2$.

9. A silicate according to claim 7, characterized in that it is of formula $Y_{1.76}Tm_{0.24}SiO_5$.

10. A laser having a laser cavity (2) containing as the light emitter a monocrystal (4), means (12,14) for amplifying the light from the monocrystal, means (14) for removing light from the laser cavity and optical pumping means (6,22,24), characterized in that the monocrystal has the following formula (I):

$$Y_{2-2x-2y}M_{2x}Yb_{2y}SiO_5 \quad (I)$$

in which M represents a lanthanide chosen from among erbium and thulium and x and y have numbers such that $0 < x \leq 0.2$ and $0 \leq y \leq 0.2$.

11. A laser according to claim 10, characterized in that the pumping means (6) comprise at least one laser diode.

12. A laser according to claim 10, which is wavelength tuneable in the infrared, characterized in that it has tuneability means and in that M represents Tm with $0 < x \leq 0.2$ and $y = 0$.

13. A laser according to claim 10 emitting at 1.55 μm, characterized in that M represents Er with $0 < x \leq 0.15$ and $0 \leq y \leq 0.2$.

* * * * *